(12) United States Patent
Wang

(10) Patent No.: US 9,494,843 B2
(45) Date of Patent: Nov. 15, 2016

(54) SMD TYPE FRESNEL LED MICRO FLASH LIGHT STRUCTURE

(71) Applicant: LITE-ON SINGAPORE PTE. LTD., Midview (SG)

(72) Inventor: You-Fa Wang, Singapore (SG)

(73) Assignee: LITE-ON SINGAPORE PTE. LTD., Midview (SG)

( * ) Notice: Subject to any disclaimer, the term of this patent is extended or adjusted under 35 U.S.C. 154(b) by 0 days.

(21) Appl. No.: 14/744,236

(22) Filed: Jun. 19, 2015

(65) Prior Publication Data

US 2016/0246161 A1 Aug. 25, 2016

(30) Foreign Application Priority Data

Feb. 24, 2015 (TW) .............................. 104105853 A

(51) Int. Cl.
  *G02B 3/08* (2006.01)
  *G03B 15/02* (2006.01)
  *G02B 3/06* (2006.01)

(52) U.S. Cl.
  CPC ............... *G03B 15/02* (2013.01); *G02B 3/06* (2013.01); *G02B 3/08* (2013.01)

(58) Field of Classification Search
  CPC ............ G02B 3/08; G02B 3/06; F21L 4/00; F21L 4/005; F21L 4/02; F21L 4/022; F21L 4/025; F21L 4/027; F21L 7/00; F21L 4/02; F21V 23/0414; F21V 5/02; F21V 5/045; F21V 15/01; F21V 5/006; F21Y 2103/10; F21Y 2105/10
  See application file for complete search history.

(56) References Cited

U.S. PATENT DOCUMENTS

| | | | | | |
|---|---|---|---|---|---|
| 4,141,059 | A * | 2/1979 | Shiojiri | ................. | G03B 15/05 362/16 |
| 4,356,538 | A * | 10/1982 | Plummer | ............... | G03B 15/05 362/16 |
| 4,412,276 | A * | 10/1983 | Blinow | ..................... | F21V 7/10 362/16 |
| 4,504,889 | A * | 3/1985 | Goldfarb | ................ | F21L 4/005 362/186 |
| 4,530,040 | A * | 7/1985 | Petterson | .................. | F21L 4/00 362/188 |
| 4,926,299 | A * | 5/1990 | Gilson | ....................... | F21L 4/02 362/184 |
| 5,410,563 | A * | 4/1995 | Nakamura | ............... | B41J 2/471 372/101 |
| 5,490,045 | A * | 2/1996 | Lindner | .................. | F21L 11/00 340/908.1 |
| 6,461,024 | B1 * | 10/2002 | Becker | ................ | B60Q 3/0203 362/187 |
| 7,093,953 | B1 * | 8/2006 | Dicke | ...................... | B60Q 7/00 340/907 |
| 8,277,077 | B2 * | 10/2012 | Georgitsis | ........... | B60Q 1/0483 362/217.12 |
| 8,585,230 | B2 * | 11/2013 | Schopper | ............ | F21V 33/0048 362/307 |
| 8,813,399 | B2 * | 8/2014 | Miedema | ...................... | 362/237 |
| 2005/0018435 | A1 * | 1/2005 | Selkee | ...................... | F21L 4/02 362/427 |
| 2011/0007505 | A1 * | 1/2011 | Wang | ..................... | F21S 8/086 362/235 |

* cited by examiner

*Primary Examiner* — Hargobind S Sawhney
(74) *Attorney, Agent, or Firm* — Li & Cai Intellectual Property (USA) Office

(57) ABSTRACT

A SMD type Fresnel LED micro flash light structure, which is adapted to a camera of a mobile phone, includes a housing, an array-type light source and a micro-cylindrical Fresnel lens. The housing has a bottom wall and a plurality of side walls, and defines a longitudinal direction and a width direction. The array-type light source is disposed on the bottom wall along the longitudinal direction. The micro-cylindrical Fresnel lens covers the housing, and includes a cylindrical plano-convex lens, and two teeth-shaped lens sections respectively arranged at two sides of the cylindrical plano-convex lens. Each teeth-shaped lens section has a plurality of bar teeth-shaped lenses. The cylindrical plano-convex lens and the bar teeth-shaped lenses are parallel to each other along the width direction. A central axis of the cylindrical plano-convex lens is corresponding to a central position of the array-type light source.

11 Claims, 5 Drawing Sheets

SMD TYPE FRESNEL LED MICRO FLASH LIGHT STRUCTURE

BACKGROUND OF THE INVENTION

1. Field of the Invention

The instant disclosure relates to a SMD type Fresnel LED micro flash light structure, which can be used in a camera or portable electronic device with the photographic function, such as a camera of a mobile phone; in particular, to a Fresnel flashlight structure having at least two LEDs with Fresnel lens of technology art of photograph.

2. Description of Related Art

Since electronic products have developed rapidly, many portable electronic devices are equipped with a camera and LED flashlight. The LED flashlight usually consists of a single or many LEDs. To conform to luminous flux and slim structure design, the Fresnel lens with light and thin characteristics has been widely applied in LED flashlight. The conventional Fresnel lens is usually circular shaped or oval-shaped, and its surface is formed of at least one set of a Fresnel zone plate with a complicated appearance.

With the increased high pixels of the camera and better photographic effect, the single LED light combined with the single Fresnel zone plate produces an oval-shaped illumination pattern and is not fit enough. As shown in FIG. 5, a conventional Fresnel lens 9 consists of two circular-shaped or oval-shaped Fresnel zone plates 91, 92, and two LEDs lights. The illumination patterns, which are produced by the Fresnel lens 9 after overlap, are usually in an 8-shape. The illumination effect at two sides of the middle portion is not uniform, and the difference between the minimum luminous intensity and highest luminous intensity is great. Therefore, the light emitted to the photograph objective cannot provide uniform illumination, and this affects the quality of the photograph. It is desired to solve the aforesaid problems of how to properly condense the light in a desired illumination pattern within the limitation of finite LED light sources.

BRIEF SUMMARY OF THE INVENTION

The instant disclosure provides a SMD type Fresnel LED micro flash light structure, having an improved Fresnel lens, and at least two LED lights for providing a brighter and uniform illumination pattern.

According to one exemplary embodiment of the instant disclosure, a SMD type Fresnel LED micro flash light structure is provided, which includes a housing, an array-type light source and a micro-cylindrical Fresnel lens. The housing has a bottom wall, and a plurality of side walls extended upward from the bottom wall to define a rectangular receiving space. The housing is defined with a longitudinal direction and a lateral direction. The array-type light source is disposed on the bottom wall in the longitudinal direction. The micro-cylindrical Fresnel lens covers a top end of the housing, which includes a cylindrical plano-convex lens, and two teeth-shaped lens sections respectively arranged at two sides of the cylindrical plano-convex lens. Each of the teeth-shaped lens sections has a plurality of bar teeth-shaped lenses. The cylindrical plano-convex lens and the bar teeth-shaped lenses are parallel to each other in the lateral direction. The cylindrical plano-convex lens has a central axis corresponding to a central location of the array-type light source. The teeth-shaped lens sections of the micro-cylindrical Fresnel lens face the array-type light source. The micro-cylindrical Fresnel lens has a plane. The cylindrical plano-convex lens and the teeth-shaped lens sections are opposite.

Thus, the present disclosure has advantages as follows. The present disclosure provides a flash illumination pattern which is substantially rectangular-shaped and has uniform illuminance.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
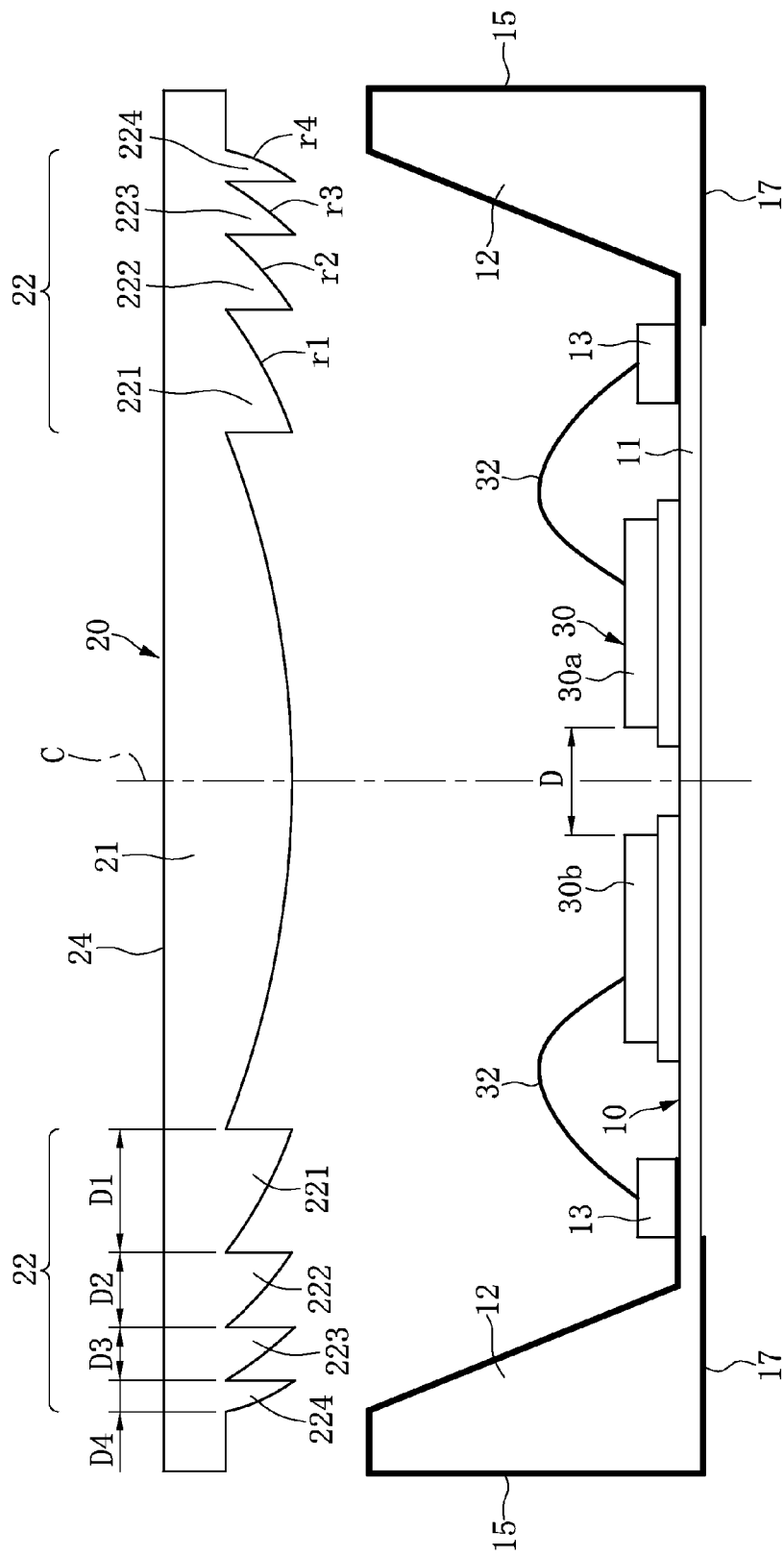
FIG. 1 is a cross-sectional view of an SMD type Fresnel LED micro flash light structure of the instant disclosure.

Please refer to FIG. 1, which is a cross-sectional view of micro-cylindrical Fresnel LED micro flash light structure. The Fresnel LED micro flash light structure includes a housing 10, a micro-cylindrical Fresnel lens 20 disposed on the housing 10, and an array-type light source 30 disposed in the housing 10.

The housing 10 has a bottom wall 11, and side walls 12, 14 extended upward from the bottom wall 11 to define a receiving space. The housing 10 defines a longitudinal direction (that is along the side walls 14) and a lateral direction (that is along the side walls 12).

The micro-cylindrical Fresnel lens 20 covers on a top end of the housing 10. The top surface of the Fresnel lens 20 is planar shaped, and has a bottom surface which is the object side of the optical surface and faces the array-type light source 30. The micro-cylindrical Fresnel lens 20 can be made of optical glass or optical plastic material. Method of manufacturing can be molding technology, or roll-to-roll replication process.

Figure 2A:
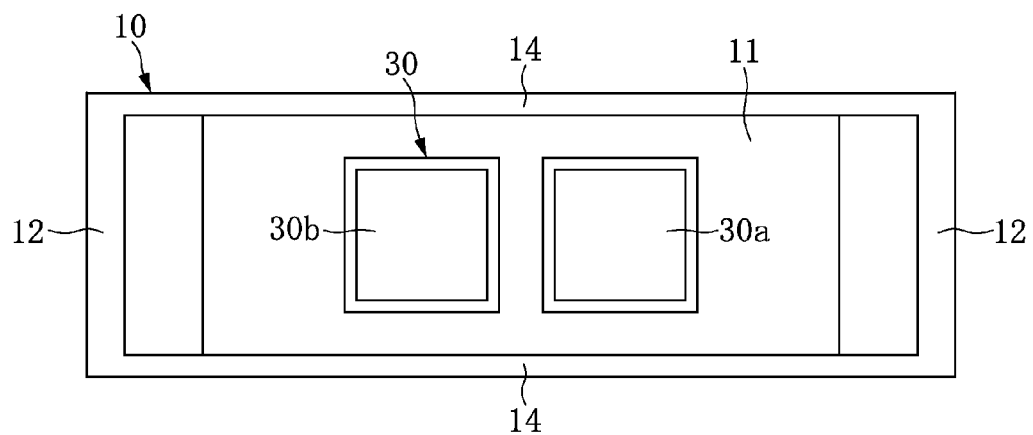
FIG. 2A is a top view of an SMD type Fresnel LED micro flash light structure with the lens moved of the instant disclosure.
Figure 2B:
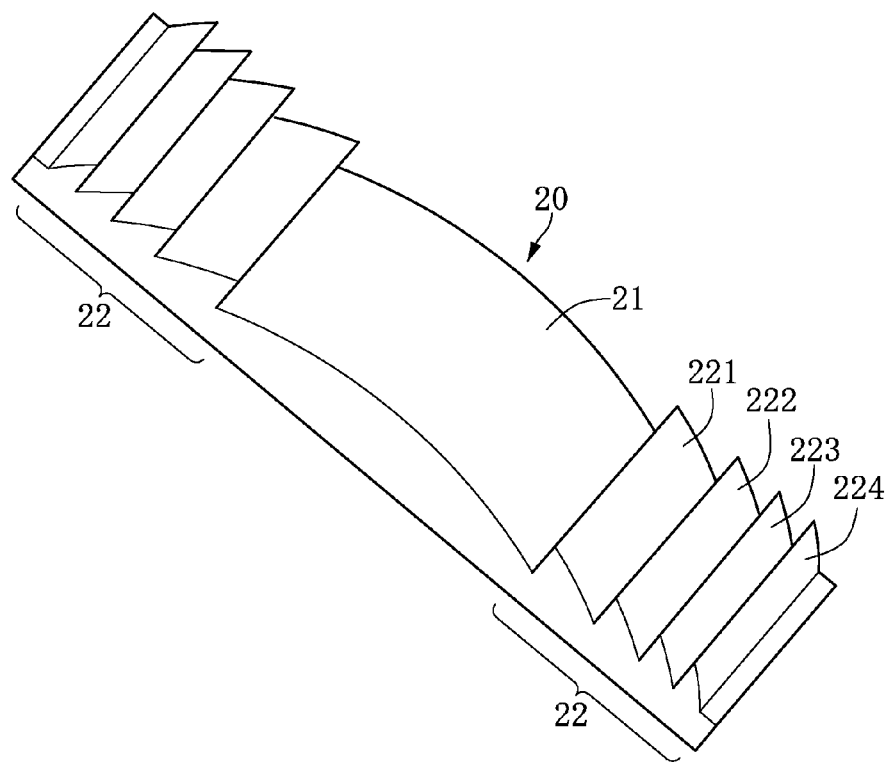
FIG. 2B is a perspective view micro-cylindrical Fresnel lens according to the instant disclosure.

Refer to FIGS. 1 and 2B. FIG. 2B is a perspective view of Fresnel lens of this present disclosure. The micro-cylindrical Fresnel lens 20 includes a cylindrical plano-convex lens 21, and two teeth-shaped lens sections 22 respectively located at two sides of the cylindrical plano-convex lens 21. Each teeth-shaped lens section 22 has a plurality of bar teeth-shaped lenses 221, 222, 223, 224 in parallel. Concerning the teeth-shaped lens section 22, there are four bar teeth-shaped lenses exemplified in this embodiment, but its quantity is not limited thereto. The quantity can be changed according to the size of the housing 10. The cylindrical plano-convex lens 21 and the bar teeth-shaped lenses 221, 222, 223, 224 are parallel to each other along the lateral direction. The cylindrical plano-convex lens 21 has a central axis C corresponding to a central position of the array-type light source 30. The teeth-shaped lens section 22 of the micro-cylindrical Fresnel lens 20 faces the array-type light source 30. The micro-cylindrical Fresnel lens 20 has a plane 24 opposite to the cylindrical plano-convex lens 21 and the teeth-shaped lens section 22.

Refer to FIG. 2A. FIG. 2A is a top view of an SMD type Fresnel LED micro flash light structure with removed lens of the present disclosure. The array-type light source 30 means that there are at least two light sources, such as LEDs, arranged in an array manner. In this embodiment, the array-type light source 30 includes two LEDs 30a, 30b. The central axis C of the cylindrical plano-convex lens 21 (as shown in FIG. 1) is corresponding to the central position of the gap D between the two LEDs 30a, 30b. In addition, the two LEDs 30a, 30b are disposed on the bottom wall 11 along the longitudinal direction. To match with the arrangement of the two LEDs 30a, 30b, the housing 10 of this embodiment is rectangular-shaped. A length of the housing 10 along the longitudinal direction is double of a length of the housing 10 along the lateral direction. In addition, the micro-cylindrical Fresnel lens 20 is corresponding to the housing 10 and is rectangular-shaped. The micro-cylindrical Fresnel lens can control the radiation of the LEDs in the longitudinal direction, and the rectangular receiving space can control the radiation of the LEDs in the lateral direction. Therefore, an illuminating area can be provided with a length being double of the width.

Refer to FIG. 1. The bottom wall 11 of the housing 10 is formed with conductive portions 13. The side walls 12 of the housing 10 are formed with a surface conductive layer 15 bending to a bottom surface of the housing 10 to form at least one soldering portion 17. LEDs 30a, 30b are electrically connected to the conductive portion 13 by a wire 32. Therefore, it can utilize an SMT (Surface-mount technology) process to install the Fresnel LED micro flash light structure through it bottom, so that the present disclosure becomes a SMD (surface-mount device). The soldering portion 17 is only exemplified as one embodiment of surface-mount device according to this present disclosure.

Figure 3:
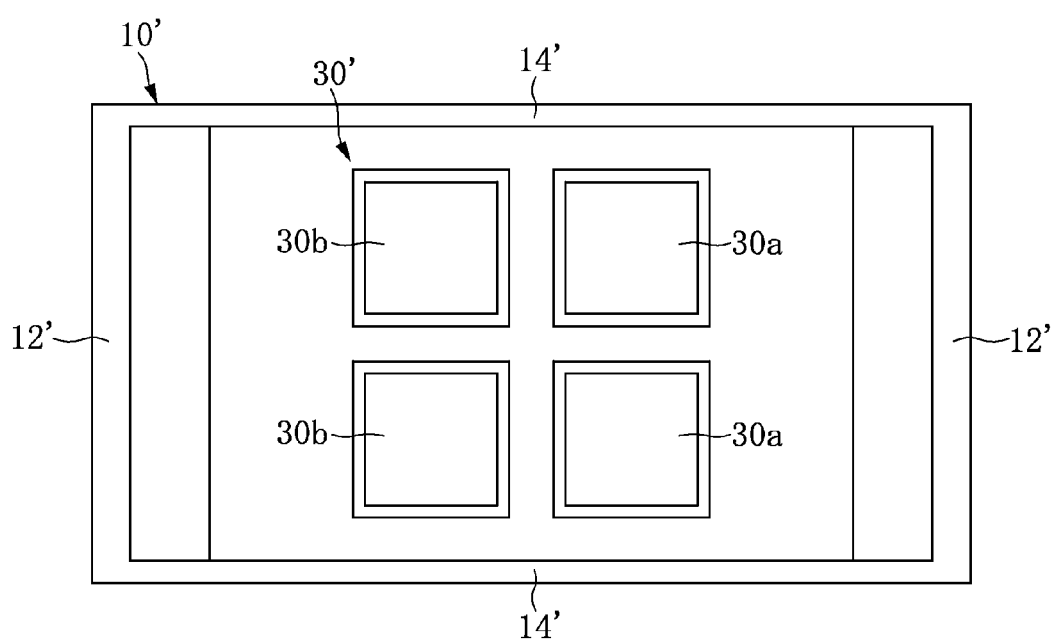
FIG. 3 is a top view of array-type light source of another embodiment according to the instant disclosure.

The array-type light source of this present disclosure is not limited by the aforesaid embodiments. Refer to in FIG. 3, which is another embodiment of array-type light source according to the present disclosure. In this embodiment, the array-type light source 30' includes four LEDs 30a, 30b arranged into two rows. Each row has two LEDs 30a, 30b. The central axis of the cylindrical plano-convex lens is aligned with the central position of the four LEDs 30a, 30b. To be compatible with the quantity of the array-type light sources, the length ratio of the side walls 12', 14' of the housing 10' can be adjusted. Accordingly, the array-type light source of the present disclosure can consist of six LEDs, which are divided into two rows and three LEDs in each row.

According to the present disclosure, an embodiment can be applied for a camera of a compact portable electronic device, and its size can be smaller than 8 mm×5 mm×2 mm (length×width×height). The gap D between LEDs 30a, 30b can be 200 to 600 micrometers. Two LEDs 30a, 30b are located under a projection scope of the cylindrical plano-convex lens 21, that is, located just under the cylindrical plano-convex lens 21A practical embodiment of the present disclosure is exemplified as follows. The cylindrical plano-convex lens 21 has a Conic coefficient between 1.3 to 1.8, a radius between 3.5 mm to 5.5 mm, a ratio of Depth/Frequency between 0.22 to 0.3, a radial height smaller than 4, a ratio of width/radial height smaller than 2.5, and number of teeth smaller than 12.

Refer to FIG. 1. Each of the bar teeth-shaped lenses 221, 222, 223, 224 has a vertical surface perpendicular to the bottom wall 11 and a curvature. Each bar teeth-shaped lenses 221, 222, 223, 224 has a curved surface with a curvature r1, r2, r3, r4, which are gradually increased from the interior to the exterior. For an easy fabrication, each of the vertical surfaces of the bar teeth-shaped lenses 221, 222, 223, 224 is formed with a draft angle between 3 degrees to 7 degrees, so that the bar teeth-shaped lens is released from a mold easily. If each two end points of each curved surface are connected and treated as a bevel surface, the slopes of the bevel surfaces of the bar teeth-shaped lenses gradually increase from the interior to the exterior. Each of the bar teeth-shaped lenses 221, 222, 223, 224 has a width D1, D2, D3, D4 along the longitudinal direction, which is gradually decreased from the interior to the exterior. Therefore, the bar teeth-shaped lenses 221, 222, 223, 224 of this embodiment can condense light beams more concentratedly and emit therethrough, and even have higher intensity than the light condensed by the cylindrical plano-convex lens 21.

Figure 4B:
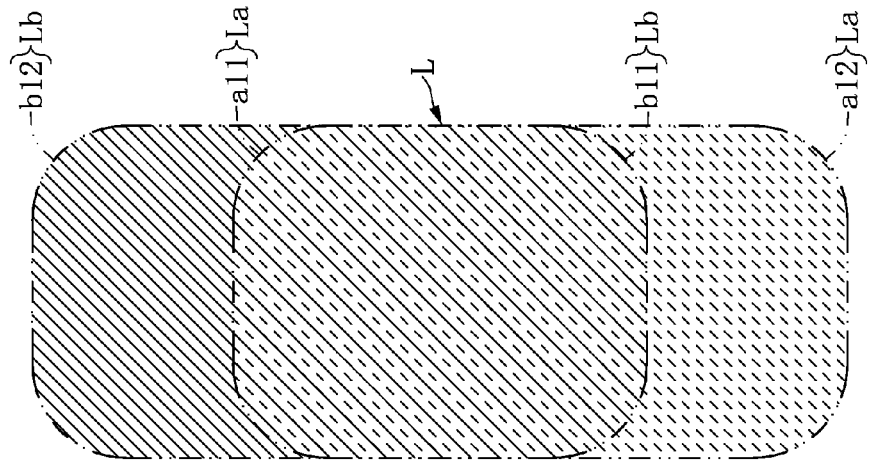
FIG. 4B is a schematic diagram of light beam producing an illuminating area on a screen according to the present disclosure.
Figure 4A:
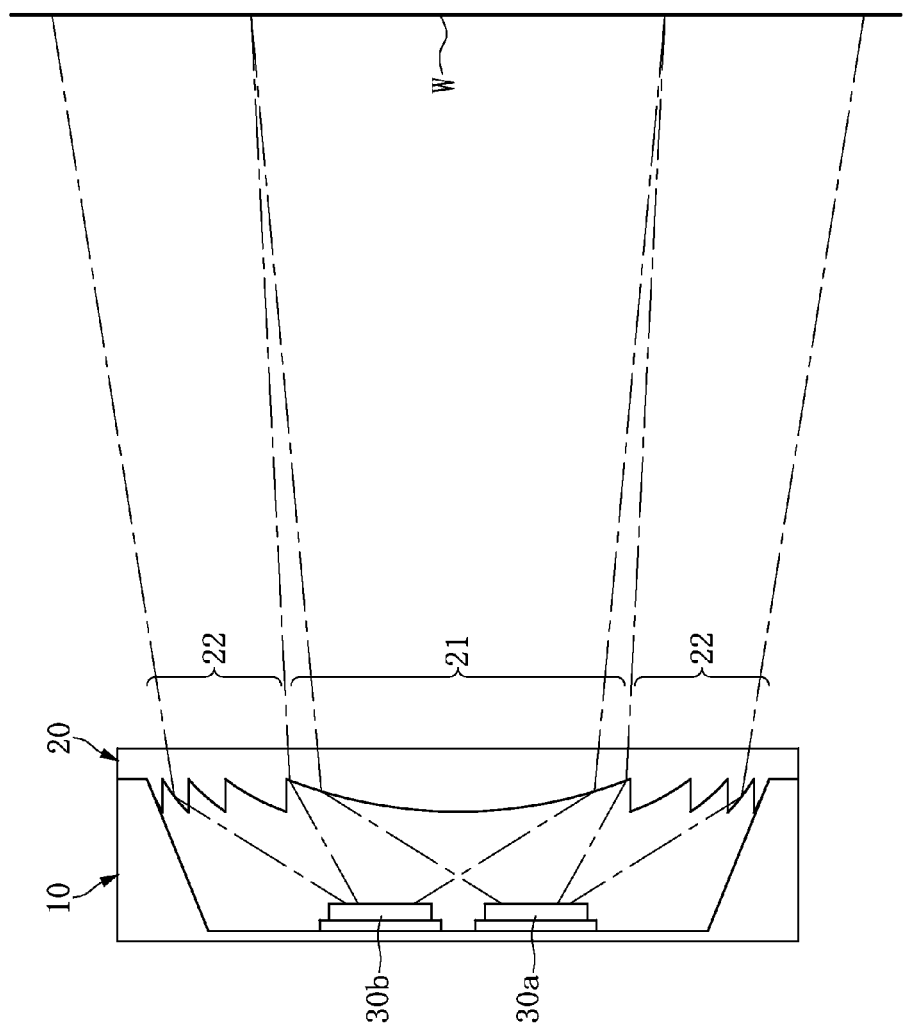
FIG. 4A is a perspective view of the SMD type Fresnel LED micro flash light structure emitting light on screen W of the present disclosure.
Figure 5:
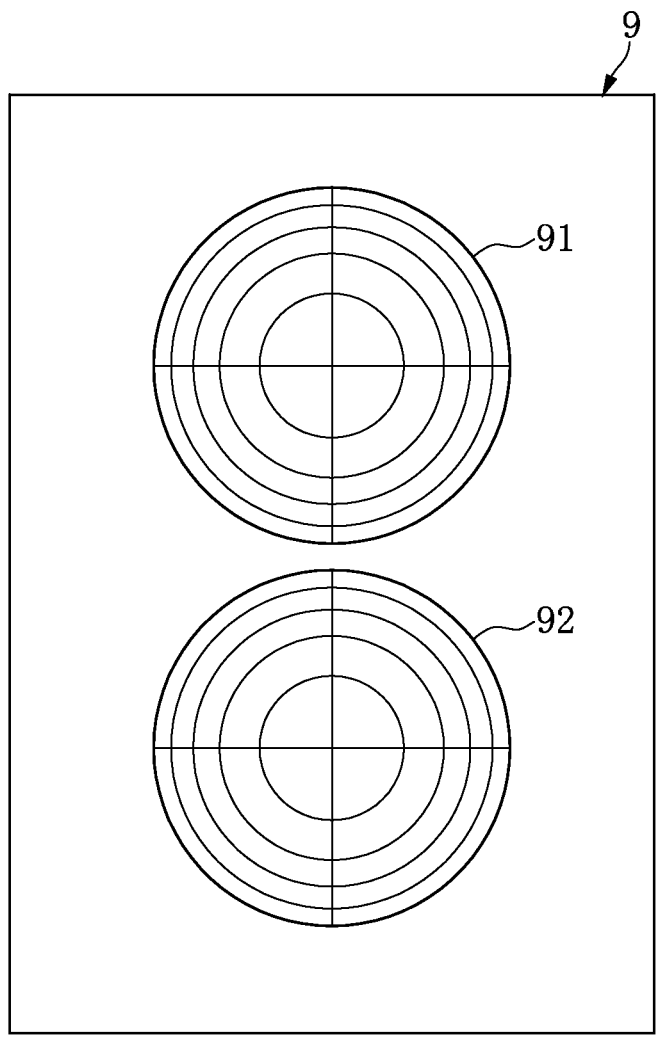
FIG. 5 is a top view of a Fresnel lens of prior art.

Refer to FIG. 4A and FIG. 4B. FIG. 4A is a perspective view of the SMD type Fresnel LED micro flash light structure illuminating light on screen W of the present disclosure. FIG. 4B is a schematic diagram of a light beam producing an illuminating area L on a screen W. The micro-cylindrical Fresnel lens 20 can control the radiation of the longitudinal direction LED. The rectangular receiving space can control the radiation of the LED in the lateral direction. According to a testing standard, the flashlight is disposed about one meter away from the screen W. Through the rectangular-shaped micro-cylindrical Fresnel lens 20, this embodiment produces an illuminating area in a substantially rectangular shape. The LED 30a produces a rectangular-shaped illuminating area La, which is located at a partial lower portion of the middle of the whole illumination pattern L. The LED 30b produces a rectangular-shaped illuminating area Lb, which is located at a partial upper portion of the middle of the whole illumination pattern L. The illuminating area La can be divided into a central area a11 and a peripheral area a12. The illuminating area Lb can be divided into a central area b11 and a peripheral area b12.

Refer to FIG. 4B. Since the two central areas a11, b11 are overlapped, there is a higher luminous intensity. In this embodiment, the two peripheral areas a12, b12 have much more condensed light through the bar teeth-shaped lenses 221, 222, 223, 224. The luminous intensity of the peripheral area a12 is increased, and even the peripheral area b12 has luminous intensity higher than the luminous intensity of the central area b11. To compare the peripheral areas a12, b12 having higher luminous intensity with the luminous intensity of the two central areas a11, b11 overlapped together, this embodiment can reduce the difference of luminous intensity between the luminous intensity of the individual peripheral area a12, b12 and the luminous intensity of the overlapped central area a11, b12. In addition, the illumination pattern of the central area a11, b12 is substantially rectangular-shaped and has uniform luminous intensity. Through testing, the minimum luminous intensity of this embodiment is at least 30% greater than the peak luminous intensity, and it really can provide a flash illumination pattern in a rectangular shape with uniform luminous intensity.

To compare this embodiment with the conventional art having two micro-cylindrical Fresnel lens in concentric circles shape, the illumination pattern of the conventional art is substantially oval-shaped not rectangular-shaped. The illumination effect of the conventional art appears as an 8-shaped illumination pattern, and the illumination effect of its middle area is not uniform.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A SMD type Fresnel LED micro flash light structure, comprising:
    a housing, having a bottom wall, and a plurality of side walls extended upward from the bottom wall to define a rectangular receiving space, the housing being defined with a longitudinal direction and a lateral direction;
    an array-type light source, disposed on the bottom wall along the longitudinal direction; and
    a micro-cylindrical Fresnel lens, covering on a top end of the housing, wherein the micro-cylindrical Fresnel lens has a cylindrical plano-convex lens, and two teeth-shaped lens sections arranged at two sides of the cylindrical plano-convex lens respectively, each teeth-shaped lens section having a plurality of bar teeth-shaped lenses; wherein the cylindrical plano-convex lens and the bar teeth-shaped lenses are parallel to each other along the lateral direction; a central axis of the cylindrical plano-convex lens corresponding to a central position of the array-type light source, wherein the teeth-shaped lens sections of the micro-cylindrical Fresnel lens faces the array-type light source, wherein the micro-cylindrical Fresnel lens has a plane opposite to the cylindrical plano-convex lens and the teeth-shaped lens sections;
    wherein each of the bar teeth-shaped lenses has a vertical surface substantially perpendicular to the bottom wall and a curvature, each of the bar teeth-shaped lenses has a curved surface with a curvature gradually increased from an interior to an exterior, each of the bar teeth-shaped lenses has a width along the longitudinal direction gradually decreased from the interior to the exterior.

2. The SMD type Fresnel LED micro flash light structure according to claim 1, wherein the housing is rectangular-shaped, a length of the housing along the longitudinal direction being double of a length of the housing along the lateral direction, and the micro-cylindrical Fresnel lens is rectangular-shaped corresponding to the housing.

3. The SMD type Fresnel LED micro flash light structure according to claim 2, wherein the array-type light source includes two LEDs, a central axis of the cylindrical plano-convex lens is aligned with a central position of a gap between the two LEDs.

4. The SMD type Fresnel LED micro flash light structure according to claim 3, wherein the two LEDs are located in a projection scope of the cylindrical plano-convex lens.

5. The SMD type Fresnel LED micro flash light structure according to claim 3, wherein a gap between the two LEDs is 200 to 600 micrometers, a distance between the two LEDs and the Fresnel lens is 350 to 450 micrometers.

6. The SMD type Fresnel LED micro flash light structure according to claim 1, wherein the array-type light source includes four LEDs arranged in an array manner, wherein the LEDs are arranged into two rows, and each row has two LEDs, a central axis of the cylindrical plano-convex lens is aligned with a central position of the four LEDs.

7. The SMD type Fresnel LED micro flash light structure according to claim 1, wherein each of the vertical surfaces of the bar teeth-shaped lenses is formed with a draft angle between 3 degrees to 7 degrees, thereby the bar teeth-shaped lens is released from a mold easily.

8. The SMD type Fresnel LED micro flash light structure according to claim 1, wherein the cylindrical plano-convex lens has a Conic coefficient between 1.3 to 1.8, a radius between 3.5 mm to 5.5 mm, and a ratio of Depth/Frequency between 0.22 to 0.3.

9. The SMD type Fresnel LED micro flash light structure according to claim 8, wherein the cylindrical plano-convex lens has a radial height smaller than 4, a ratio of width/radial height smaller than 2.5, number of teeth smaller than 12.

10. The SMD type Fresnel LED micro flash light structure according to claim 1, wherein the housing has a bottom formed with at least one soldering portion, so as to become a surface-mount device.

11. A SMD type Fresnel LED micro flash light structure, comprising:
    a housing, having a bottom wall, and plurality of side walls extended upward from the bottom wall to define a rectangular receiving space, the housing being defined with a longitudinal direction and a lateral direction;
    an array-type light source, disposed on the bottom wall along the longitudinal direction; and
    a micro-cylindrical Fresnel lens, covering on a top end of the housing, wherein the micro-cylindrical Fresnel lens has a cylindrical plano-convex lens, and two teeth-shaped lens sections arranged at two sides of the cylindrical plano-convex lens respectively, each teeth-shaped lens section having a plurality of bar teeth-shaped lenses; wherein the cylindrical plano-convex lens and the bar teeth-shaped lenses are parallel to each other along the lateral direction; a central axis of the cylindrical plano-convex lens corresponding to a central position of the array-type light source, wherein the teeth-shaped lens sections of the micro-cylindrical Fresnel lens faces the array-type light source, wherein the micro-cylindrical Fresnel lens has a plane opposite to the cylindrical plano-convex lens and the teeth-shaped lens sections;
    wherein the housing has a bottom formed with at least one electrically conductive soldering portion, so as to become a surface-mount device.

* * * * *